United States Patent
Li

(10) Patent No.: US 10,153,308 B1
(45) Date of Patent: Dec. 11, 2018

(54) MANUFACTURING METHOD FOR THIN FILM TRANSISTOR AND ARRAY SUBSTRATE

(71) Applicant: Shenzhen China Star Optoelectronics Technology Co., Ltd., Shenzhen, Guangdong (CN)

(72) Inventor: Jinming Li, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/570,260

(22) PCT Filed: Jul. 26, 2017

(86) PCT No.: PCT/CN2017/094550
§ 371 (c)(1),
(2) Date: Oct. 27, 2017

(51) Int. Cl.
*H01L 27/12* (2006.01)
*H01L 29/66* (2006.01)
*H01L 21/02* (2006.01)
*H01L 21/385* (2006.01)
*H01L 21/477* (2006.01)
*H01L 29/24* (2006.01)
*H01L 29/49* (2006.01)
*H01L 29/786* (2006.01)
*H01L 21/443* (2006.01)
*H01L 27/32* (2006.01)

(52) U.S. Cl.
CPC ...... *H01L 27/127* (2013.01); *H01L 21/02488* (2013.01); *H01L 21/02565* (2013.01); *H01L 21/02631* (2013.01); *H01L 21/385* (2013.01); *H01L 21/443* (2013.01); *H01L 21/477* (2013.01); *H01L 27/1225* (2013.01); *H01L 29/24* (2013.01); *H01L 29/4908* (2013.01); *H01L 29/66969* (2013.01); *H01L 29/7869* (2013.01); *H01L 29/78618* (2013.01); *H01L 27/3262* (2013.01)

(58) Field of Classification Search
CPC ............... H01L 27/127; H01L 27/1225; H01L 27/3262; H01L 29/4908; H01L 21/477
USPC .......................................................... 438/23
See application file for complete search history.

(56) References Cited

U.S. PATENT DOCUMENTS

2018/0197973 A1* 7/2018 Deng ................ H01L 29/66969

* cited by examiner

*Primary Examiner* — Anthony Ho
(74) *Attorney, Agent, or Firm* — Andrew C. Cheng

(57) ABSTRACT

The present disclosure provides a method for manufacturing a thin film transistor comprising: forming a buffer layer, an oxide semiconductor layer, a gate insulating layer, and a gate electrode sequentially on a substrate, wherein on both sides of the first region of the oxide semiconductor layer are second regions where the gate electrode is exposed; forming an aluminum layer covering the buffer layer, the second regions of the oxide semiconductor layer and the gate electrode by a physical vapor deposition method, and annealing the aluminum layer, making the second regions of the oxide semiconductor layer being doped by aluminum ions to form conductor regions; etching the remaining aluminum layer after the annealing treatment; renovating the etched surfaces of the buffer layer, the gate electrode and the conductor regions, and oxidizing the conductor regions; stacking an insulating layer, and forming a source electrode and a drain electrode on the insulating layer.

10 Claims, 4 Drawing Sheets

MANUFACTURING METHOD FOR THIN FILM TRANSISTOR AND ARRAY SUBSTRATE

CROSS REFERENCE TO RELATED APPLICATIONS

This application claims priority to Chinese Patent Application No. 201710408480.9, entitled "Manufacturing Method for Thin Film Transistor and Array Substrate", filed on Jun. 2, 2017, the disclosure of which is incorporated herein by reference in its entirety.

FIELD OF THE INVENTION

The present disclosure relates to the field of the manufacturing method for a thin film transistor, in particular to a manufacturing method for a thin film transistor and an array substrate.

BACKGROUND OF THE INVENTION

TFT LCD (Thin-Film Transistor Liquid Crystal Display) has been widely used because of its advantages of high speed, high brightness, high contrast and the like. Among them, in a top gate metal oxide thin film crystal structure, the existence of parasitic capacitance can be reduced, thereby having obvious advantages. However, a metal conductor oxide film in the top gate metal oxide thin film crystal structure is very sensitive to acid, since even weak acid can quickly corrode oxide semiconductor. Plasma implantation doping treatment has poor stability, and metal doping treatment exists the problem of uneven oxide. Therefore, conductor processing technology is an urgent problem to be solved currently.

SUMMARY OF THE INVENTION

The present disclosure provides a method for manufacturing a thin film transistor for improving the uniformity of metal doping in an oxide semiconductor.

The present disclosure also provides a method for manufacturing an array substrate.

A method for manufacturing a thin film transistor according to the present disclosure, the method comprising: forming a buffer layer, an oxide semiconductor layer, a gate insulating layer, and a gate electrode sequentially on a substrate, and the gate insulating layer and the gate electrode being sequentially stacked on a first region of the oxide semiconductor layer, wherein on both sides of the first region of the oxide semiconductor layer are second regions where the gate electrode is exposed;

forming an aluminum layer covering the buffer layer, the second regions of the oxide semiconductor layer and the gate electrode by a physical vapor deposition method, and annealing the aluminum layer, making the second regions of the oxide semiconductor layer being doped by aluminum ions to form conductor regions;

etching the remaining aluminum layer covering the buffer layer and the second regions of the oxide semiconductor layer after the annealing treatment;

renovating the etched surfaces of the buffer layer, the gate electrode and the conductor regions by annealing, and oxidizing the conductor regions by annealing at the same time;

stacking an insulating layer on the buffer layer, the gate electrode and the conductor regions, and forming a source electrode and a drain electrode on the insulating layer, the source electrode and the drain electrode respectively being connected to the two conductor regions through via holes.

Hereinto, in the step of forming an aluminum layer covering the buffer layer, the second regions of the oxide semiconductor layer and the gate electrode by a physical vapor deposition method, and annealing the aluminum layer, the thickness of the aluminum layer is in a range of 20 Å to 200 Å and the annealing temperature is in a range of 100 to 400 degrees.

In the step of renovating the etched surfaces of the buffer layer, the gate electrode and the conductor regions by annealing, and oxidizing the conductor regions by annealing at the same time, the annealing temperature is in a range of 100 to 400 degrees.

Hereinto, the step of forming a buffer layer, an oxide semiconductor layer, a gate insulating layer, and a gate electrode sequentially on a substrate, and the gate insulating layer and the gate electrode being sequentially stacked on a first region of the oxide semiconductor layer comprises:

forming the buffer layer by using a plasma chemical vapor deposition method;

depositing an oxide material layer on the buffer layer by a physical vapor deposition method;

annealing the oxide material layer at an annealing temperature of 150 to 450° C.;

patterning the oxide material layer to form the oxide semiconductor layer.

Hereinto, the step of forming a buffer layer, an oxide semiconductor layer, a gate insulating layer, and a gate electrode sequentially on a substrate, and the gate insulating layer and the gate electrode being sequentially stacked on a first region of the oxide semiconductor layer further comprises:

forming the gate insulating layer by a plasma chemical vapor deposition method;

depositing a metal layer on the gate insulating layer by a physical vapor deposition method and patterning the metal layer to form the gate electrode.

Hereinto, the gate insulating layer is made of silicon oxide (SiOx) or a composite layer of silicon oxide (SiOx) and silicon nitride (SiNx), and the material of the gate electrode is one or a composite metal of aluminum, molybdenum, copper, and titanium.

Hereinto, the step of stacking an insulating layer on the buffer layer, the gate electrode and the conductor regions, and forming a source electrode and a drain electrode on the insulating layer, the source electrode and the drain electrode respectively being connected to the two conductor regions through via holes comprises:

depositing the insulating layer by a plasma chemical vapor deposition method and forming the via holes in the insulating layer which are connected to the conductor regions by a patterning method;

depositing a metal layer on the insulating layer by a physical vapor deposition method;

patterning the metal layer to form the source electrode and the drain electrode.

Hereinto, in the step of depositing an oxide material layer on the buffer layer by a physical vapor deposition method, the thickness of the oxide material layer is in a range of 300 Å to 1000 Å.

Hereinto, the insulating layer is made of silicon oxide (SiOx) or a composite layer of silicon oxide (SiOx) and silicon nitride (SiNx).

Hereinto, the material of the buffer layer is silicon oxide (SiOx), and the deposited thickness of the buffer layer is in a range of 2000 Å to 5500 Å.

A method for manufacturing an array substrate provided by the present disclosure comprises:

providing a substrate, on the surface of which a thin film transistor is formed;

forming a display element on the thin film transistor.

The method for manufacturing a thin film transistor according to the present disclosure uses an annealing treatment to inject metal ions covering the oxide semiconductor layer into an oxide semiconductor layer to form a conductor structure, which ensures the uniformity of the metal doping in the oxide, thereby ensuring the performance of the thin film transistor.

BRIEF DESCRIPTION OF THE DRAWINGS

In order to illustrate technical solutions of present disclosure more clearly, the drawings needed in the description of embodiments of present disclosure will be introduced briefly. Apparently, hereinafter described drawings are merely a portion of embodiments of present disclosure. For those skilled in the art, they can obtain other drawings on the base of these drawings without creative work.

FIG. 3 is a flowchart of a method for manufacturing the array substrate according to some embodiments of the present disclosure.

DETAILED DESCRIPTION OF ILLUSTRATED EMBODIMENTS

In order to make those skilled in the art understand the technical solutions of present disclosure better, clear and complete, description of the technical solutions of present disclosure will be illustrated, which combined with the drawings of embodiments in present disclosure. Apparently, described embodiments are merely a portion of embodiments of present disclosure, rather than all of the embodiments. Base on the embodiments of present disclosure, all other embodiments obtained by those skilled in the art without creative work are considered to be encompassed within the scope of the present disclosure.

Figure 1:
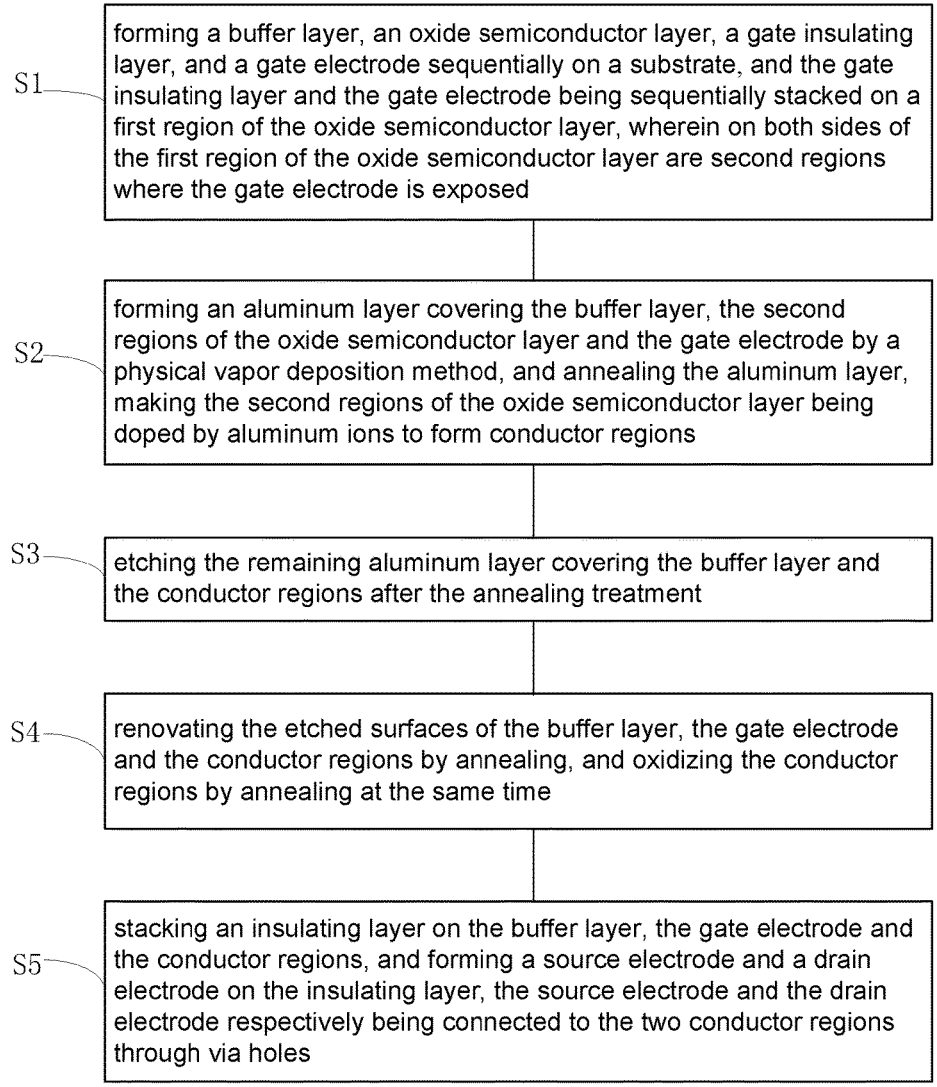
FIG. 1 is a flowchart of a method for manufacturing the thin film transistor according to some embodiments of the present disclosure.
Figure 2:
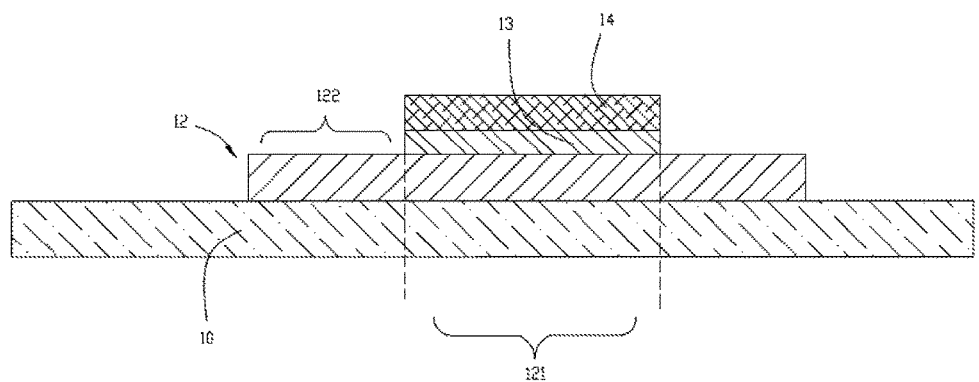
FIG. 2 to FIG. 5 are schematic views showing the respective steps of the thin film transistor manufacturing method described in the FIG. 1 according to some embodiments of the present disclosure.

Referring to FIG. 1, the present disclosure provides a method for manufacturing a thin film transistor, which is particularly suitable for the production of a top gate metal oxide thin film crystal, the method comprises:

referring to FIG. 2, S1, forming a buffer layer 11, an oxide semiconductor layer 12, a gate insulating layer 13, and a gate electrode 14 sequentially on a substrate 10, and the gate insulating layer 13 and the gate electrode 14 being sequentially stacked on a first region 121 of the oxide semiconductor layer 12. On both sides of the first region 121 of the oxide semiconductor layer 12 are second regions 122 where the gate electrode 14 is exposed.

This step specifically comprises:

forming the buffer layer 11 by using a plasma chemical vapor deposition method;

depositing an oxide material layer (not shown in FIG.) on the buffer layer 11 by a physical vapor deposition method, wherein the thickness of the oxide material layer is in a range of 300 Å to 1000 Å;

annealing the oxide material layer at an annealing temperature of 150 to 450 degrees;

patterning the oxide material layer to form the oxide semiconductor layer 12.

This step further comprises:

forming the gate insulating layer 13 by a plasma chemical vapor deposition method;

depositing a metal layer on the gate insulating layer 13 by a physical vapor deposition method, and patterning the metal layer to form the gate electrode 14. The term "patterning" means that the entire layer is processed to form patterns by processes such as yellow light, exposure, etching and the like.

In this embodiment, the gate insulating layer 13 is made of silicon oxide (SiOx) or a composite layer of silicon oxide (SiOx) and silicon nitride (SiNx). The material of the gate electrode 14 is one or a composite metal of aluminum, molybdenum, copper, and titanium. Certainly, the materials of the gate insulating layer 13 and the gate electrode 14 are not limited to the materials described above.

The material of the buffer layer is silicon oxide (SiOx) and the deposited thickness of the buffer layer is in a range of 2000 Å to 5500 Å.

Figure 3:
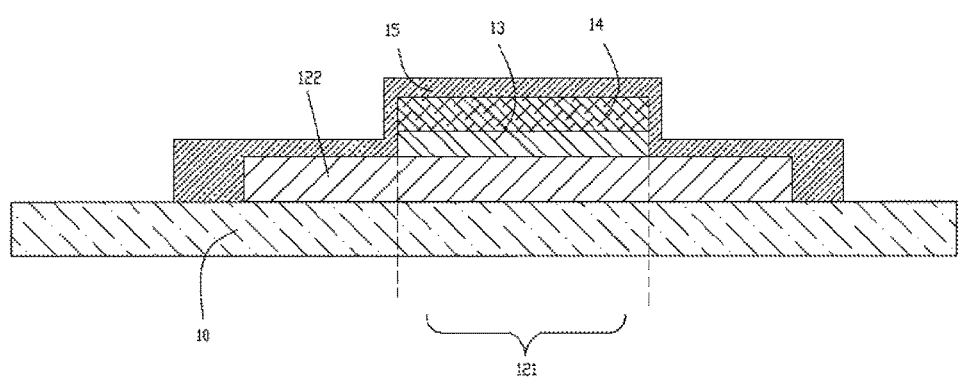

Referring to FIG. 3, S2, an aluminum layer 15 covering the buffer layer 11, the second regions 122 of the oxide semiconductor layer 12 and the gate electrode 14 is formed by a physical vapor deposition method, and the aluminum layer 15 is annealed, which makes the second regions 122 of the oxide semiconductor layer 12 being doped by aluminum ions to form conductor regions 16. Aluminum ions are input to the oxide semiconductor layer to form a conductor layer by the annealing treatment, which can ensure the uniformity of ion implantation, thereby ensuring the stability of the conductor layer.

In this embodiment, the thickness of the aluminum layer is in a range of 20 Å to 200 Å and the annealing temperature is in a range of 100 to 400 degrees. The purpose of this step is to diffuse the aluminum into the second regions 122 of the oxide semiconductor layer 12 for making them conductive.

Figure 4:
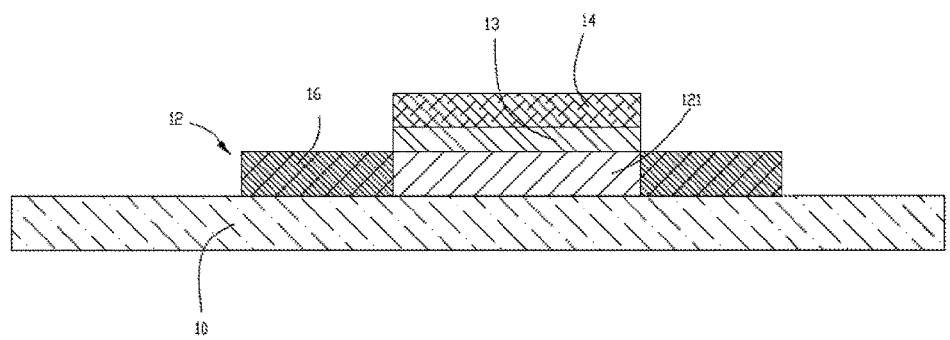

Referring to FIG. 4, S3, the remaining aluminum layer covering the buffer layer 11 and the second regions 122 of the oxide semiconductor layer 12 is etched after the annealing treatment. In this step, a portion of the aluminum ion enters the second regions 122 of the oxide semiconductor layer 12 mainly after the annealing step, but still the aluminum layer is remaining on the surfaces of the buffer layer 11, the second regions 122 of the oxide semiconductor layer 12 (i.e., the conductor regions 16) and the gate electrode 14, thus the remaining aluminum layer is removed by etching to avoid affecting the subsequent process and performance of the thin film transistor.

S4, the etched surfaces of the buffer layer 11, the gate electrode 14 and the conductor regions 16 formed in the oxide semiconductor layer 12 are renovated by annealing process, and the conductor regions 16 are oxidized by annealing process. In this step, the annealing temperature is in a range of 100 to 400 degrees. The surface of the annealed conductor regions 16 is flat, while the conductor regions 16 are oxidized to promote sufficient bonding of the aluminum ions to ensure the performance of the conductor regions.

Figure 5:
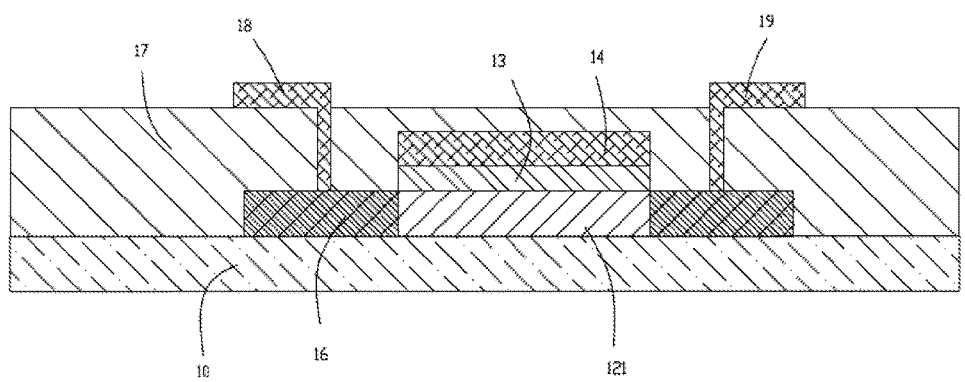

Referring to FIG. 5, S5, an insulating layer 17 is stacked on the buffer layer 11, the gate electrode 14 and the conductor regions 16. A source electrode 18 and a drain electrode 19 are formed on the insulating layer 17 and connected to the two conductor regions 16 through via holes 171, respectively. The insulating layer is made of silicon oxide (SiOx) or a composite layer of silicon oxide (SiOx) and silicon nitride (SiNx). Certainly, the type of material described above is not limited.

This step further comprises:

depositing the insulating layer 17 by a plasma chemical vapor deposition method and forming the via holes in the insulating layer which are connected to the conductor regions 16 by a patterning method;

depositing a metal layer on the insulating layer 17 by a physical vapor deposition method;

patterning the metal layer to form the source electrode 18 and drain electrode 19. The source electrode 18 and the drain electrode 19 are connected to the corresponding conductor regions 16 through the via holes.

The method for manufacturing a thin film transistor according to the present disclosure uses an annealing treatment to inject metal ions covering the oxide semiconductor layer into an oxide semiconductor layer to form a conductor structure, which ensures the uniformity of the metal doping in the oxide, thereby ensuring the performance of the thin film transistor.

Figure 6:
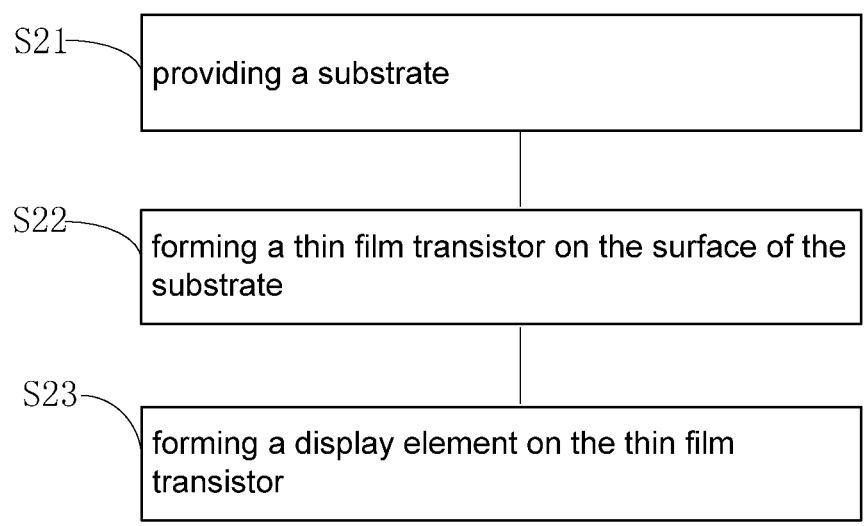
FIG. 6 is a flowchart of a method for manufacturing the thin film transistor according to some embodiments of the present disclosure.

Referring to FIG. 6, the present disclosure also provides a method for manufacturing an array substrate comprising:

S21, providing a substrate, wherein the substrate is a glass plate;

S22, forming a thin film transistor on the surface of the substrate, wherein the thin film transistor is formed by the method described above;

S23, forming a display element on the thin film transistor, wherein the display element comprises an organic light emitting diode, or a combination of a pixel electrode and a common electrode.

Above are only specific embodiments of the present invention, the scope of the present invention is not limited to this, and to those skilled in the art, change or replacement which is easily derived should be covered by the protected scope of the invention. Thus, the protected scope of the invention should go by the subject claims.

What is claimed is:

1. A method for manufacturing a thin film transistor, the method comprising:

forming a buffer layer, an oxide semiconductor layer, a gate insulating layer, and a gate electrode sequentially on a substrate, and the gate insulating layer and the gate electrode being sequentially stacked on a first region of the oxide semiconductor layer, wherein on both sides of the first region of the oxide semiconductor layer are second regions where the gate electrode is exposed;

forming an aluminum layer covering the buffer layer, the second regions of the oxide semiconductor layer and the gate electrode by a physical vapor deposition method, and annealing the aluminum layer, making the second regions of the oxide semiconductor layer being doped by aluminum ions to form conductor regions;

etching the remaining aluminum layer covering the buffer layer and the conductor regions after the annealing treatment;

renovating the etched surfaces of the buffer layer, the gate electrode and the conductor regions by annealing, and oxidizing the conductor regions by annealing at the same time;

stacking an insulating layer on the buffer layer, the gate electrode and the conductor regions, and forming a source electrode and a drain electrode on the insulating layer, the source electrode and the drain electrode respectively being connected to the two conductor regions through via holes.

2. The method for manufacturing a thin film transistor as claimed in claim 1, wherein in the step of forming an aluminum layer covering the buffer layer, the second regions of the oxide semiconductor layer and the gate electrode by a physical vapor deposition method, and annealing the aluminum layer, the thickness of the aluminum layer is in a range of 20 Å to 200 Å and the annealing temperature is in a range of 100 to 400 degrees.

3. The method for manufacturing a thin film transistor as claimed in claim 1, wherein in the step of renovating the etched surfaces of the buffer layer, the gate electrode and the conductor regions by annealing, and oxidizing the conductor regions by annealing at the same time, the annealing temperature is in a range of 100 to 400 degrees.

4. The method for manufacturing a thin film transistor as claimed in claim 1, wherein the step of forming a buffer layer, an oxide semiconductor layer, a gate insulating layer, and a gate electrode sequentially on a substrate, and the gate insulating layer and the gate electrode being sequentially stacked on a first region of the oxide semiconductor layer comprises:

forming the buffer layer by using a plasma chemical vapor deposition method;

depositing an oxide material layer on the buffer layer by a physical vapor deposition method;

annealing the oxide material layer at an annealing temperature of 150 to 450 degrees;

patterning the oxide material layer to form the oxide semiconductor layer.

5. The method for manufacturing a thin film transistor as claimed in claim 4, wherein the step of forming a buffer layer, an oxide semiconductor layer, a gate insulating layer, and a gate electrode sequentially on a substrate, and the gate insulating layer and the gate electrode being sequentially stacked on a first region of the oxide semiconductor layer further comprises:

forming the gate insulating layer by a plasma chemical vapor deposition method;

depositing a metal layer on the gate insulating layer by a physical vapor deposition method and patterning the metal layer to form the gate electrode.

6. The method for manufacturing a thin film transistor as claimed in claim 5, wherein the gate insulating layer is made of silicon oxide (SiOx) or a composite layer of silicon oxide (SiOx) and silicon nitride (SiNx), and the material of the gate electrode is one or a composite metal of aluminum, molybdenum, copper, and titanium.

7. The method for manufacturing a thin film transistor as claimed in claim 1, wherein the step of stacking an insulating layer on the buffer layer, the gate electrode and the conductor regions, and forming a source electrode and a drain electrode on the insulating layer, the source electrode and the drain electrode respectively being connected to the two conductor regions through via holes comprises:

depositing the insulating layer by a plasma chemical vapor deposition method and forming the via holes in the insulating layer which are connected to the conductor regions by a patterning method;

depositing a metal layer on the insulating layer by a physical vapor deposition method;

patterning the metal layer to form the source electrode and the drain electrode.

8. The method for manufacturing a thin film transistor as claimed in claim 4, wherein in the step of depositing an oxide material layer on the buffer layer by a physical vapor deposition method, the thickness of the oxide material layer is in a range of 300 Å to 1000 Å.

9. The method for manufacturing a thin film transistor as claimed in claim 7, wherein the material of the buffer layer is silicon oxide (SiOx), and the deposited thickness of the buffer layer is in a range of 2000 Å to 5500 Å.

10. A method for manufacturing an array substrate comprising:
providing a substrate;
forming a thin film transistor on the surface of the substrate, which comprises:
forming a buffer layer, an oxide semiconductor layer, a gate insulating layer, and a gate electrode sequentially on the substrate, and the gate insulating layer and the gate electrode being sequentially stacked on a first region of the oxide semiconductor layer, wherein on both sides of the first region of the oxide semiconductor layer are second regions where the gate electrode is exposed;
forming an aluminum layer covering the buffer layer, the second regions of the oxide semiconductor layer and the gate electrode by a physical vapor deposition method, and annealing the aluminum layer, making the second regions of the oxide semiconductor layer being doped by aluminum ions to form conductor regions;
etching the remaining aluminum layer covering the buffer layer and the conductor regions after the annealing treatment;
renovating the etched surfaces of the buffer layer, the gate electrode and the conductor regions by annealing, and oxidizing the conductor regions by annealing at the same time;
stacking an insulating layer on the buffer layer, the gate electrode and the conductor regions, and forming a source electrode and a drain electrode on the insulating layer, the source electrode and the drain electrode respectively being connected to the two conductor regions through via holes;
forming a display element on the thin film transistor.

* * * * *